(12) United States Patent
Chang et al.

(10) Patent No.: US 8,216,937 B2
(45) Date of Patent: Jul. 10, 2012

(54) METHOD OF FABRICATING DISPLAY DEVICE

(75) Inventors: Youn Gyoung Chang, Gyeonggi-do (KR); Nam Kook Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 208 days.

(21) Appl. No.: 12/639,365

(22) Filed: Dec. 16, 2009

(65) Prior Publication Data

US 2010/0159695 A1    Jun. 24, 2010

(30) Foreign Application Priority Data

Dec. 24, 2008    (KR) .................. 10-2008-0133634

(51) Int. Cl.
*H01L 21/44* (2006.01)

(52) U.S. Cl. ................. 438/669; 257/E21.211

(58) Field of Classification Search .............. 257/797, 257/E23.179; 438/401, 975
See application file for complete search history.

(56) References Cited

U.S. PATENT DOCUMENTS 7,300,830 B2 * 11/2007 Yoo et al. .............. 438/151
2005/0237453 A1 * 10/2005 Ha et al. ............... 349/113
* cited by examiner

*Primary Examiner* — David S Blum
*Assistant Examiner* — Sonya McCall Shepard
(74) *Attorney, Agent, or Firm* — Morgan, Lewis & Bockius LLP (57) ABSTRACT

Disclosed is a method of fabricating a display device. The method includes providing a substrate in which a display region and a pad region formed around the display region are defined, forming a conductive layer on the substrate, forming a mask pattern by rolling a roller on the conductive layer, and patterning the conductive layer using the mask pattern to form a line in the display region and a pad in the pad region. The pad is formed of a pattern having a second width corresponding to a first width of the line.

8 Claims, 13 Drawing Sheets

METHOD OF FABRICATING DISPLAY DEVICE

CROSS-REFERENCE TO RELATED APPLICATION

This application claims priority under 35 U.S.C. 119 to Korean Patent Application No. 10-2008-00133634 (filed on Dec. 24, 2008) which is hereby incorporated by reference in its entirety.

BACKGROUND

1. Field of the Disclosure

This disclosure relates to a method of fabricating display device.

2. Description of the Related Art

Recently, a micro-photolithography process is widely used to form a fine pattern in an LCD process or semiconductor process. In the photolithography process, a circuit line width, or a pattern line width, is determined based on the wavelength of light used in an exposure process. Considering the current technology level, it is very difficult to form an ultrafine pattern that is not greater than 100 μm on a substrate using the photolithography process.

In addition, as the line width in the ultrafine pattern is further decreased, costly equipment such as an exposure apparatus is needed which increases start investment costs. Also, the cost for a mask of a high resolution increases so that efficiency may be deteriorated.

Also, since exposure, baking after exposure, development, baking after development, etching, and cleaning are needed whenever a pattern is formed, a process time is prolonged and the process becomes complex.

A printing process that is a new process to solve the above problem has been developed by imprint an initial nano-scale. The printing process is a method of directly printing on a substrate by forming a pattern on a roller.

BRIEF SUMMARY

Accordingly, the present embodiments are directed to a method of fabricating a display device that substantially obviates one or more of problems due to the limitations and disadvantages of the related art.

An object of the present embodiment is to provide a display device fabricating method that prevents defects caused in a printing process.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to one general aspect of the present embodiment, a method of fabricating a display device includes providing a substrate in which a display region and a pad region formed around the display region are defined, forming a conductive layer on the substrate, forming a mask pattern by rolling a roller on the conductive layer, and patterning the conductive layer using the mask pattern to form a line in the display region and a pad in the pad region, wherein the pad is formed of a pattern having a second width corresponding to a first width of the line.

The method of fabricating a display device according to the present disclosure allows lines and pads to be formed in patterns having similar widths. That is, the width of a pad is very larger than that of a line. The pad is formed of a pattern having a width substantially the same as or similar to the width of the line.

In the method of fabricating a display device according to the present disclosure, the pads and the lines are formed by a roll printing process. When patterns having quite different widths are attached to the roller, a defect may be generated in the roll printing process due to the deviation in the width of patterns.

In the method of fabricating a display device according to the present disclosure, since the lines and the pads are formed of patterns having similar widths, the deviation in the width of patterns attached to the roller is negligible in the roll printing process to form the lines and the pads. Thus, a defect may be prevented from being generated in the roll printing process.

Thus, the method of fabricating a display device of the present embodiment can prevent defects caused in a roll printing process.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings:

FIGS. 1 to 15 are views illustrating a process of fabricating a TFT array substrate according an embodiment of the present disclosure;

DETAILED DESCRIPTION

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

Reference will now be made in detail to the embodiments of the present disclosure, examples of which are illustrated in the accompanying drawings. It will be understood that when an element, such as a substrate, a layer, a region, a film, or an electrode, is referred to as being formed "on" or "under" another element in the embodiments, it may be directly on or under the other element, or intervening elements (indirectly) may be present. The term "on" or "under" of an element will be determined based on the drawings. Like reference numerals refer to like elements throughout. The present invention will now be described more fully with reference to the accompanying drawings, in which exemplary embodiments of the invention are shown. In the drawings, the thicknesses of layers and regions are exaggerated for clarity.

Figure 2:
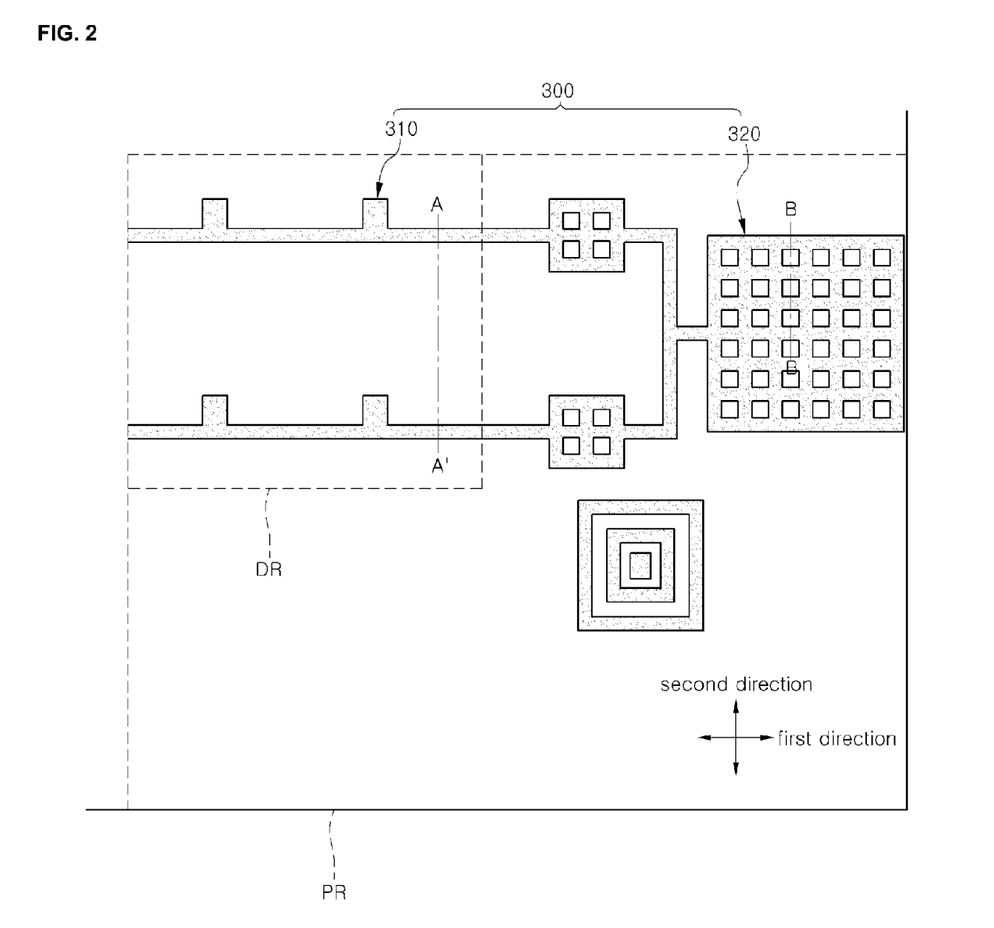
FIG. 2 is a planar view illustrating a first mask pattern.
Figure 3:
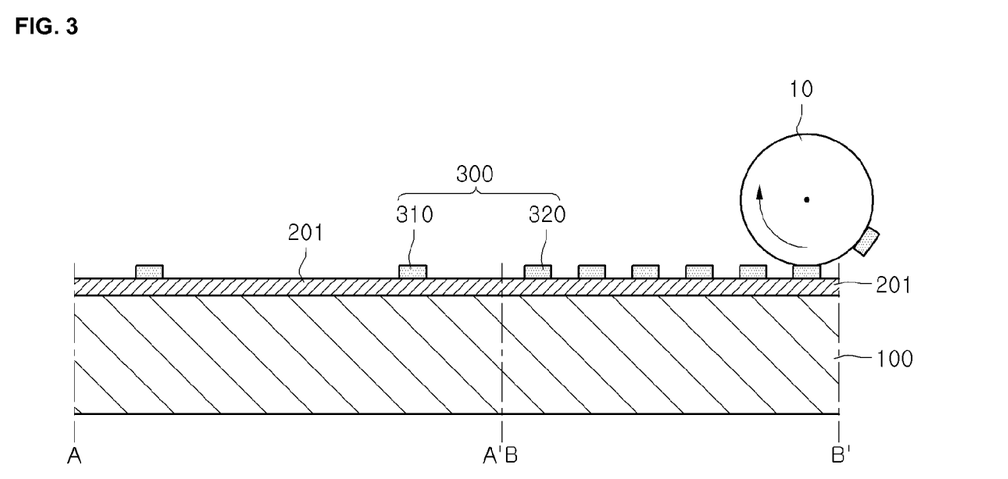
FIG. 3 is a cross-sectional view taken along lines A-A' and B-B' of FIG. 2.
Figure 4:
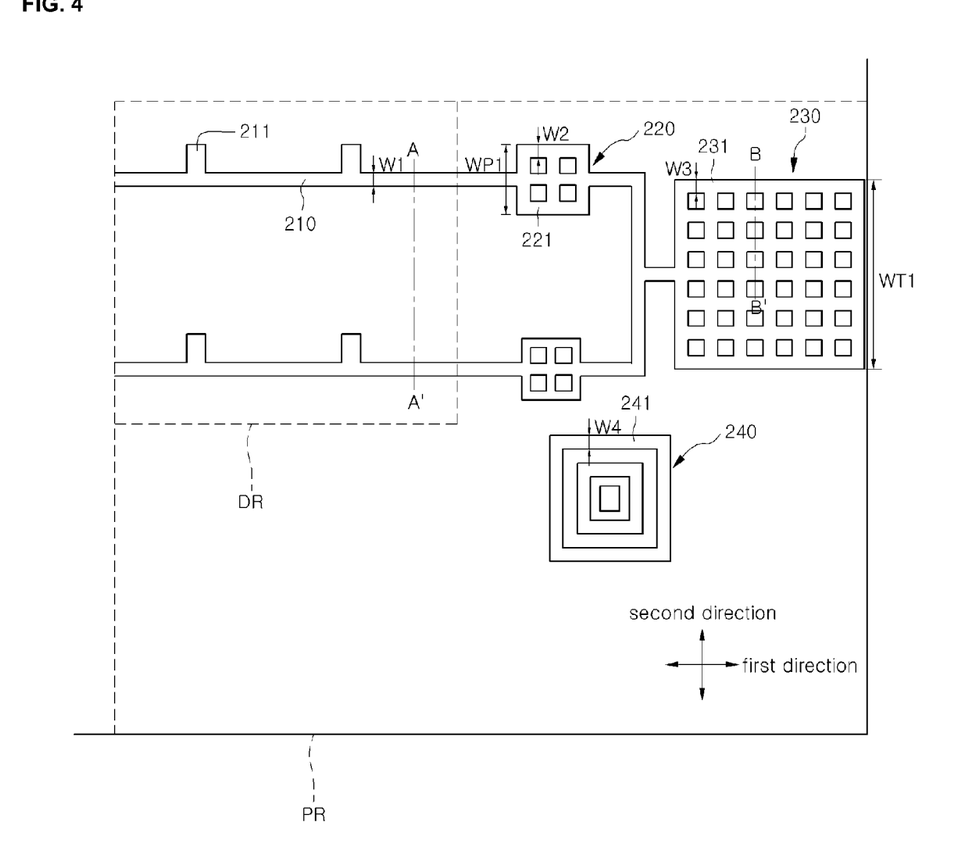
FIG. 4 is a planar view illustrating a gate line, a gate electrode, a gate pad, a gate test pad, and a first align key.
Figure 5:
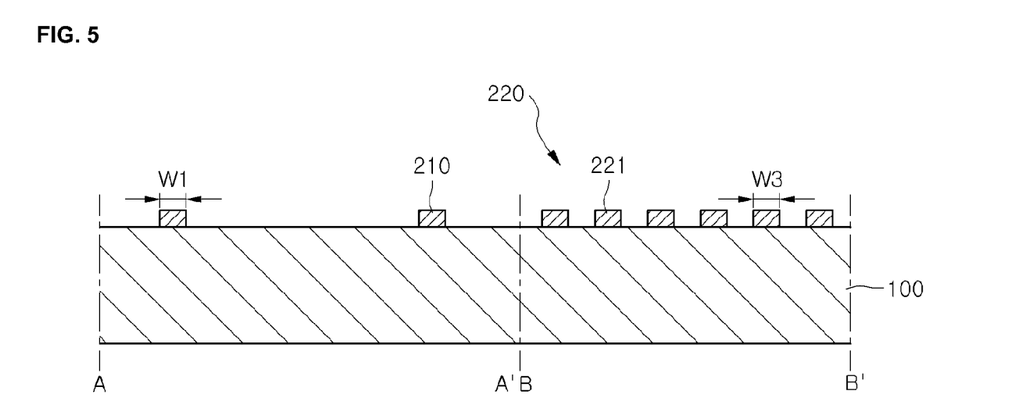
FIG. 5 is a cross-sectional view taken along lines A-A' and B-B' of FIG. 4.
Figure 6:
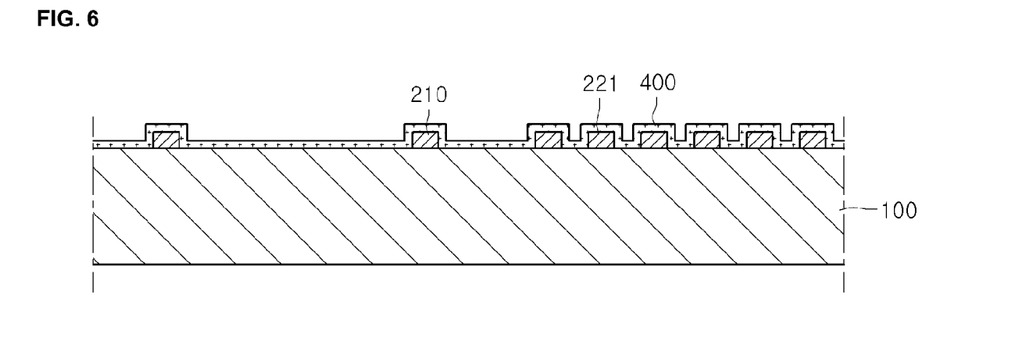
FIG. 6 is a cross-sectional view taken along lines A-A' and B-B' of FIG. 4.
Figure 7:
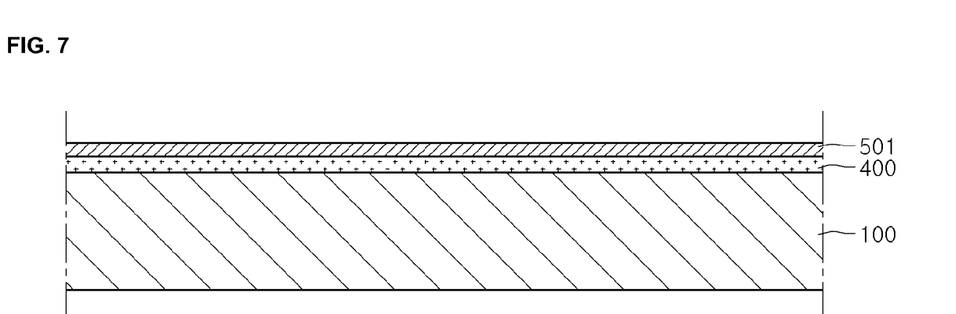
FIG. 7 is a cross-sectional view of a second conductive layer formed on a gate insulation film of a substrate.
Figure 8:
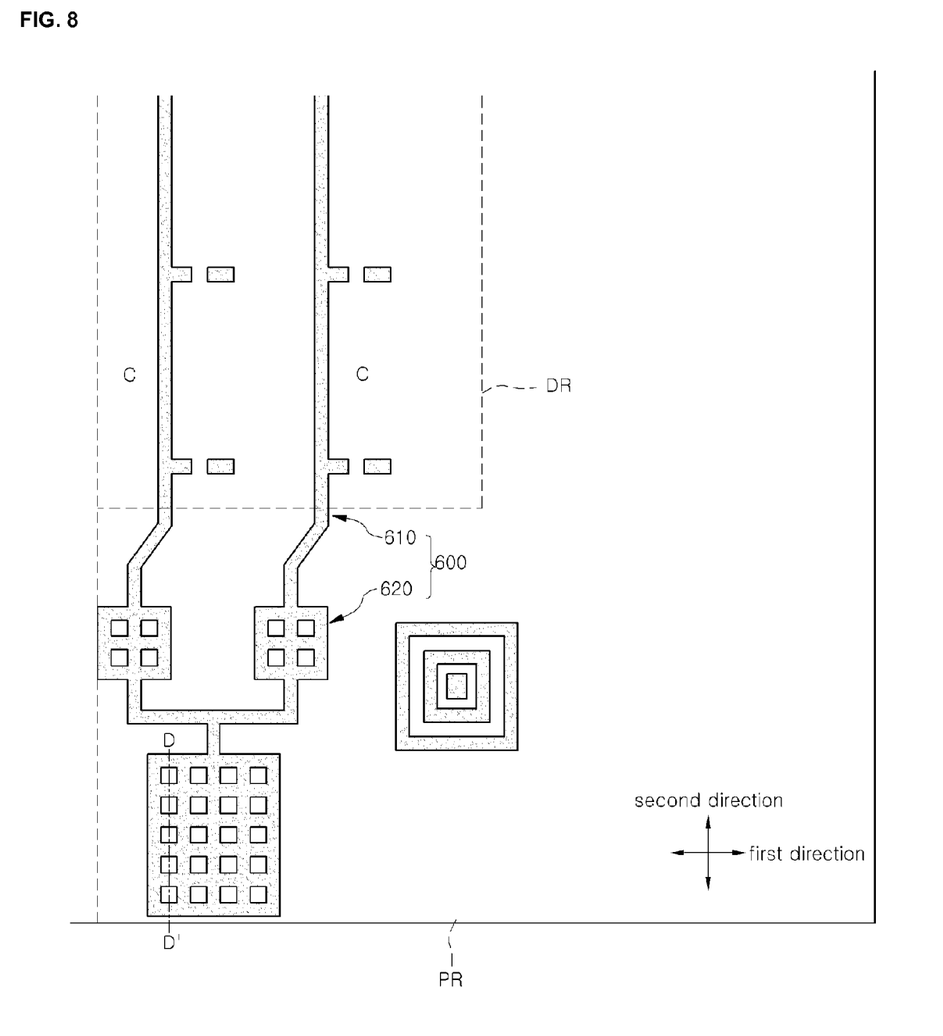
FIG. 8 is a planar view illustrating a second mask pattern.
Figure 9:
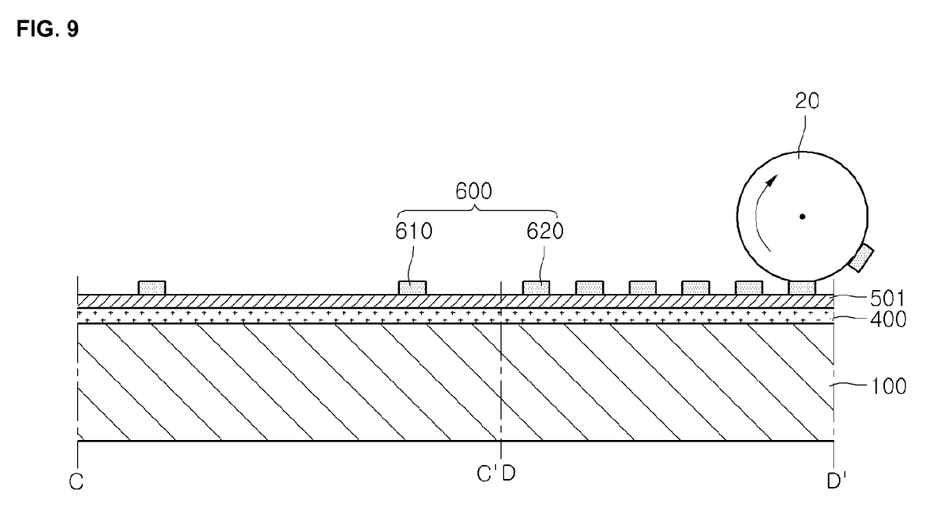
FIG. 9 is a cross-sectional view taken along lines C-C' and D-D' of FIG. 8.
Figure 10:
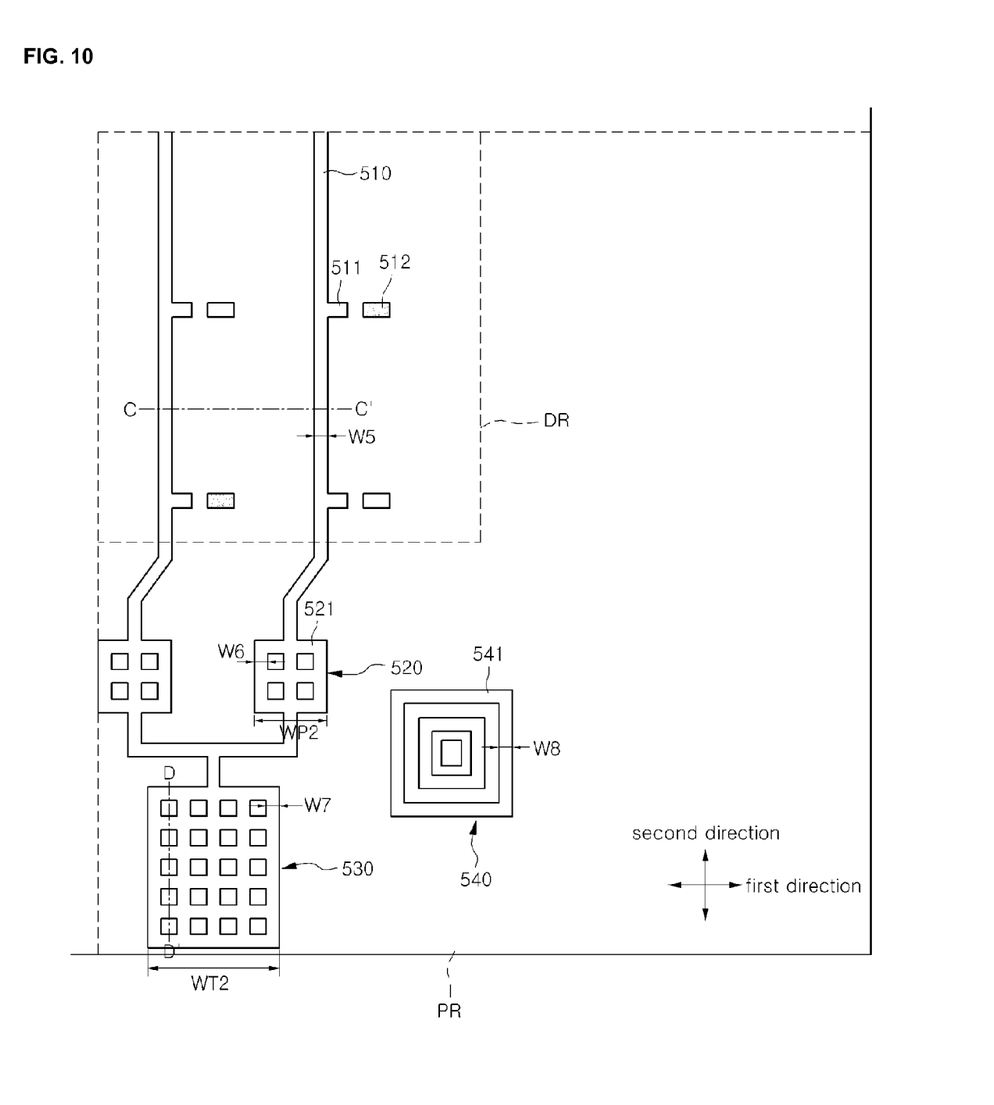
FIG. 10 is a planar view illustrating a data line, a source electrode, a drain electrode, a data pad, a data test pad, and a second align key.
Figure 11:
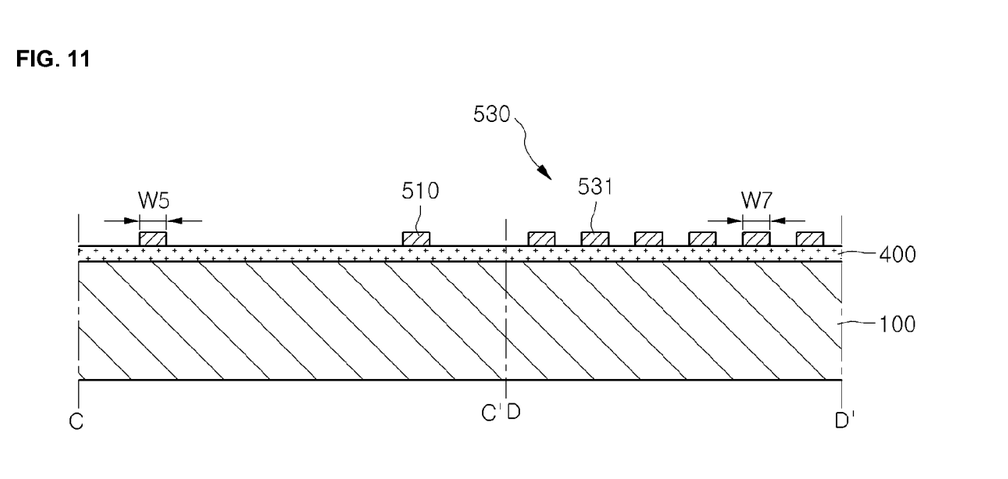
FIG. 11 is a cross-sectional view taken along lines C-C' and D-D' of FIG. 10.
Figure 12:
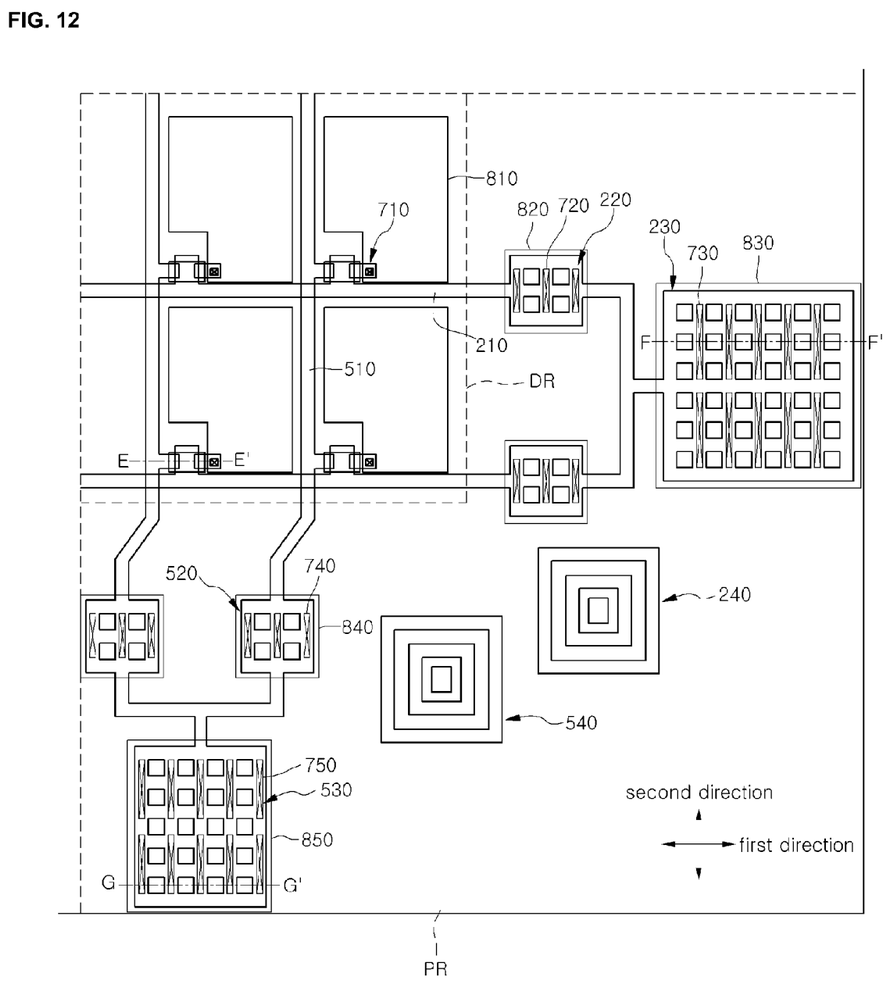
FIG. 12 is a planar view illustrating a TFT array substrate according an embodiment of the present disclosure.
Figure 13:
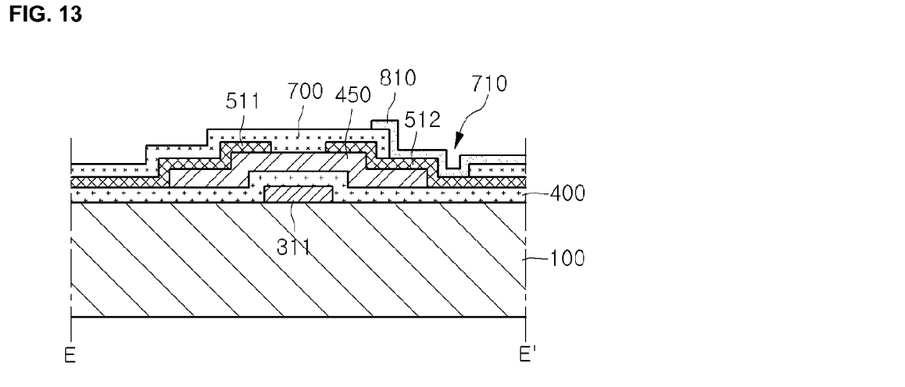
FIG. 13 is a cross-sectional view taken along line E-E' of FIG. 12.
Figure 14:
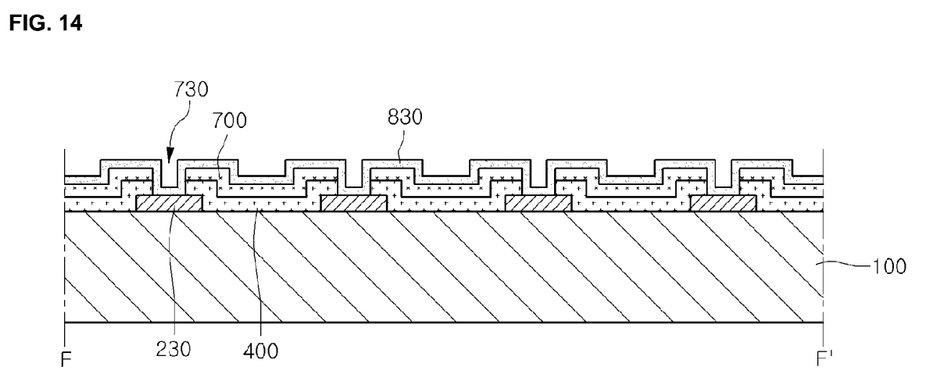
FIG. 14 is a cross-sectional view taken along line F-F' of FIG. 12.
Figure 15:
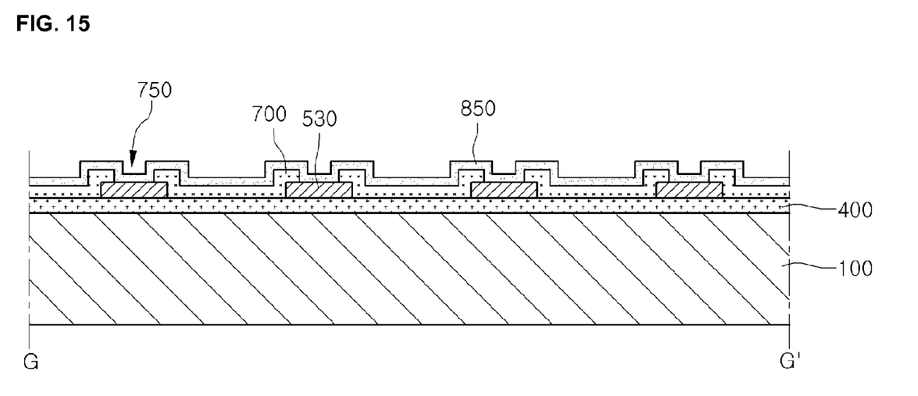
FIG. 15 is a cross-sectional view taken along line G-G' of FIG. 12.

FIGS. 1-14 illustrate a process of fabricating a TFT array substrate according an embodiment of the present disclosure. FIG. 2 is a planar view illustrating a first mask pattern. FIG. 3 is a cross-sectional view taken along lines A-A' and B-B' of FIG. 2. FIG. 4 is a planar view illustrating a gate line, a gate electrode, a gate pad, a gate test pad, and a first align key. FIG. 5 is a cross-sectional view taken along lines A-A' and B-B' of FIG. 4. FIG. 6 is a cross-sectional view taken along lines A-A' and B-B' of FIG. 4. FIG. 7 is a cross-sectional view of a second conductive layer formed on a gate insulation film of a substrate. FIG. 8 is a planar view illustrating a second mask pattern. FIG. 9 is a cross-sectional view taken along lines C-C' and D-D' of FIG. 8. FIG. 10 is a planar view illustrating a data line, a source electrode, a drain electrode, a data pad, a data test pad, and a second align key. FIG. 11 is a cross-sectional view taken along lines C-C' and D-D' of FIG. 10. FIG. 12 is a planar view illustrating a TFT array substrate according an embodiment of the present disclosure. FIG. 13 is a cross-sectional view taken along line E-E' of FIG. 12. FIG. 14 is a cross-sectional view taken along line F-F' of FIG. 12. FIG. 15 is a cross-sectional view taken along line G-G' of FIG. 12.

Figure 1:
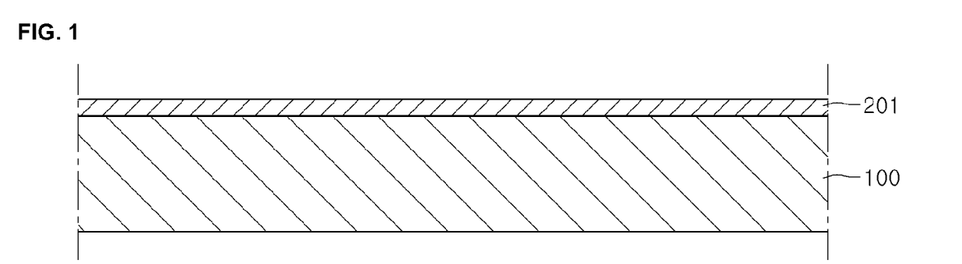

Referring to FIG. 1, a first conductive layer 201 is formed on a transparent substrate 100. The transparent substrate 100 includes a pixel region (DR) for displaying an image and a pad region (PR) formed around the DR. For example, the DR may be defined as a rectangle located at the center portion of the transparent substrate 100 and the PR may be defined in the outer portion of the transparent substrate 100. The transparent substrate 100 may be, for example, a glass substrate, a quartz substrate, or a film substrate.

The first conductive layer 201 may be formed by a chemical vapor deposition (CVD) process or a sputtering process. The first conductive layer 201 may be formed of a material such as aluminum (Al), copper (Cu), molybdenum (Mo), titanium (Ti), or an alloy thereof.

Referring to FIGS. 2 and 3, a first mask pattern 300 is formed on the first conductive layer 201. The first conductive pattern 300 is formed by a roll printing process. For example, a resin composite layer is formed by a doctor blade on an outer circumferential surface of a roller 10. The resin composite layer is patterned by a printing plate (not shown).

The roller 10 rolls on the first conductive layer 201. The patterned resin composite layer is attached to the first conductive layer 201 so that the first mask pattern 300 is formed on the first conductive layer 201. Then, the first mask pattern 300 may be cured by a thermal process. The first mask pattern 300 may be formed of patterns having constant widths. That is, the width of the first mask pattern 310 arranged in the DR corresponds to the width of the first mask pattern 320 arranged in the PR.

Referring to FIGS. 4 and 5, the first conducive layer 201 is etched using the first mask pattern 300 as an etch mask. Accordingly, a gate line 210, a gate electrode 211, a gate pad 220, a gate test pad 230, and a first align key 240 are formed on the transparent substrate 100. Thus, the gate line 210, the gate electrode 211, the gate pad 220, the gate test pad 230, and the first align key 240 have substantially the same shape as that of the first mask pattern 300.

The gate line 210 is formed in the DR. The gate line 210 extends in a first direction in multiple numbers. The first width W1 of the gate line 210 may be about 20 μm to about 300 μm. The gate electrode 211 extends from the gate line 210. The width of the gate electrode 211 may be similar to the first width W1.

The gate pad 220 is connected to an end portion of the gate line 210. The gate pad 220 is formed in the PR. The gate pad 220 includes patterns 221 having a second width W2. For example, the gate pad 220 may include a mesh pattern formed of the patterns 221 having a second width W2. The width WP1 of the gate pad 220 may be about 400 μm to about 800 μm. The second width W2 corresponds to the first width W1. That is, the second width W2 is substantially the same as or similar to the first width W1.

The gate test pad 230 is connected to the gate pad 220. The gate test pad 230 can be connected to a plurality of gate pads 220. Also, the gate test pad 230 may be an on-off pad connected to all of the gate pads 220. The gate test pad 230 includes a plurality of patterns 231 having a third width W3. For example, the gate test pad 230 may include a mesh pattern formed of the patterns 231 having a third width W3.

The width WT1 of the gate test pad 230 may be about 0.5 mm to about 2 mm. The third width W3 corresponds to the first width W1. That is, the third width W3 is substantially the same as or similar to the first width W1.

The first align key 240 has the shape of an island. The first align key 240 includes a plurality of patterns 241 having a fourth width W4. For example, the first align key 240 includes a plurality of patterns 241 having the shape of a rectangle loop.

The fourth width W4 corresponds to the first width W1. That is, the fourth width W4 is substantially the same as or similar to the first width W1. The first align key 240 aligns the gate pads 220 and pads of a first drive chip (not shown) to drive the TFT array substrate according to the present embodiment.

Referring to FIG. 6, a gate insulation film 400 is formed to cover the gate line 210, the gate pad 220, the gate test pad 230, and the first align key 240. The gate insulation film 400 may be formed of a material such as silicon oxide SiOx or silicon nitride SiNx.

Next, an amorphous silicon thin film formed of amorphous silicon and an n+amorphous silicon thin film formed of amorphous silicon into which impurities are injected at a high concentration are sequentially formed on and above the gate insulation film 400.

The amorphous silicon thin film and the n+amorphous silicon thin film are patterned by a mask process. As such, an active layer 450 is formed on the gate insulation film 400.

Referring to FIG. 7, a second conductive layer 501 covering the active layer 450 is formed on the gate insulation film 400. The second conductive layer 501 is formed by a CVD process or a sputtering process. The second conductive layer 501 is formed of a material, for example, aluminum (Al), copper (Cu), molybdenum (Mo), titanium (Ti), or an alloy thereof.

Referring to FIGS. 8 and 9, a second mask pattern 600 is formed on the second conductive layer 501. The second mask pattern 600 is formed by a roll printing process. For example, a resin composite layer is formed by a doctor blade on an outer circumferential surface of a roller 20. The resin composite layer is patterned by a printing plate (not shown).

The roller 20 rolls on the second conductive layer 501. The patterned resin composite layer is attached to the second conductive layer 501 so that the second mask pattern 600 is formed on the second conductive layer 501. Then, the second mask pattern 600 may be cured by a thermal process. The second mask pattern 600 may be formed of patterns having constant widths. That is, the width of the second pattern 610 arranged in the DR corresponds to the width of the second mask pattern 620 arranged in the PR.

Referring to FIGS. 10 and 11, the second conducive layer 501 is etched using the second mask pattern 600 as an etch mask. Accordingly, a data line 510, a source electrode 511, a drain electrode 512, a data pad 520, a data test pad 530, and a second align key 540 are formed on the transparent substrate 100. Thus, the data line 510, the source electrode 511, the drain electrode 512, the data pad 520, the data test pad 530, and the second align key 540 have substantially the same shape as that of the second mask pattern 600.

The data line 510 is formed in the DR. The data line 510 extends in a second direction in multiple numbers. The fifth width W5 of the data line 510 may be about 20 μm to about 300 μm. The source electrode 511 extends from the data line 510. The width of the source electrode 511 may be similar to the first width W1.

The drain electrode 512 is separated from the source electrode 511 and has the shape of an island. The width of the drain electrode 512 may be similar to the first width W1. The source electrode 511 and the drain electrode 512 contact the active layer 450.

The data pad 520 is connected to an end portion of the data line 510. The gate pad 520 is formed in the PR. The data pad 520 includes patterns 521 having a sixth width W6. The width WP2 of the data pad 520 may be about 400 μm to about 800 μm. For example, the data pad 520 may include a mesh pattern formed of the patterns 521 having the sixth width W6. The sixth width W6 corresponds to the fifth width W5. That is, the sixth width W6 is substantially the same as or similar to the fifth width W5.

The data test pad 530 is connected to the data pad 520. The data test pad 530 can be connected to a plurality of data pads 520. Also, the data test pad 530 may be an on-off pad connected to all of the data pads 520. The data test pad 530 includes a plurality of patterns 531 having a seventh width W7. For example, the data test pad 530 may include a mesh pattern formed of the patterns 531 having the seventh width W7. The width WT2 of the data test pad 530 may be about 0.5 mm to about 2 mm. The seventh width W7 corresponds to the fifth width W7. That is, the seventh width W7 is substantially the same as or similar to the fifth width W5.

The second align key 540 has the shape of an island. The second align key 540 includes a plurality of patterns 541 having an eighth width W8. For example, the second align key 540 may include a plurality of patterns 541 having the shape of a rectangle loop having the eighth width W8.

The eighth width W8 corresponds to the fifth width W5. That is, the eighth width W8 is substantially the same as or similar to the fifth width W5. The second align key 540 aligns the data pads 520 and pads of a second drive chip (not shown) to drive the TFT array substrate according to the present embodiment.

Referring to FIGS. 12-15, a protection film 700 is formed to cover the data line 510, the source electrode 511, the drain electrode 512, the data pad 520, the data test pad 530, and the second align key 540.

The protection film 700 is patterned to form a first contact hole 710 partially exposing the drain electrode 512, a second contact hole 720 partially exposing the gate pad 220, a third contact hole 730 partially exposing the gate test pad 230, a fourth contact hole 740 partially exposing the data pad 520, and a fifth contact hole 750 partially exposing the data test pad 530.

The first contact hole 710, the fourth contact hole 740, and the fifth contact hole 750 have the shapes extending in a direction in which the roller 20 rolls to form the second mask pattern 600. That is, when the roller 20 to form the second mask pattern 600 rolls in the second direction, the first contact hole 710, the fourth contact hole 740, and the fifth contact hole 750 have the shapes extending in the second direction.

Also, the second contact hole 720 and the third contact hole 730 have the shapes extending in a direction in which the roller 10 rolls to form the first mask pattern 300. That is, when the roller 10 to form the first mask pattern 300 rolls in the second direction, the second contact hole 720 and the third contact hole 730 have the shapes extending in the second direction.

As described above, since the second to fifth contact holes 720, 730, 740, and 750 have the shapes extending in the direction in which the rollers 10 and 20 roll to form the exposed pads 220, 230, 520, and 530, the second to fifth contact holes 720, 730, 740, and 750 and the pads 220, 230, 520, and 530 are prevented from being misaligned with each other. Thus, the second to fifth contact holes 720, 730, 740, and 750 may be more accurately formed in a direction perpendicular to the rolling direction and the misalignment with the pads 220, 230, 520, and 530 may be prevented.

After the second to fifth contact holes 720, 730, 740, and 750 are formed, a transparent conductive metal layer is formed on the protection film 700. The transparent conductive metal layer is patterned by a mask process. A pixel electrode 810 connected to the drain electrode 512 via the first contact hole 710 is formed on the protection film 700. Also, transparent conductive patterns 820, 830, 840, and 850 respectively covering the gate pad 220, the gate test pad 230, the data pad 520, and the data test pad 530 are formed on the protection film 700.

The transparent conductive patterns 820, 830, 840, and 850 are respectively connected to the gate pad 220, the gate test pad 230, the data pad 520, and the data test pad 530, via the second to fifth contact holes 720, 730, 740, and 750.

As described above, according to the method of fabricating a TFT array substrate according to the present embodiment, the gate line 210, the gate pad 22, the gate test pad 230, and the first align key 240 are formed to be patterns having similar widths. Also, the data line 510, the data pad 520, the data test pad 530, and the second align key 540 are formed to be patterns having similar widths. Accordingly, the first mask pattern 300 and the second mask pattern 600 are formed by a roll printing method to be patterns having similar widths, regardless of the DR or PR.

When patterns having remarkably different widths are attached, a defect may be generated in the roll printing process due to the deviation in the width of the patterns. However, since the first and second mask patterns 300 and 600 are formed of patterns having similar widths, a defect is prevented from being generated during a process of attaching the first and second mask patterns 300 and 600 to the first and second conductive layers 201 and 501. Thus, the method of fabricating a TFT array substrate according to the present embodiment may prevent generation of a defect in the roll printing process.

In addition, since the first to fifth contact holes 710, 720, 730, 740, and 750 have the shapes extending in the direction in which the roller 10 or 20 rolls, the TFT array substrate according to the present embodiment may prevent a contact defect.

The TFT array substrate according to the present embodiment may be used for a variety of display devices such as liquid crystal display (LCD) devices and organic light emitting display (OLED) devices. For example, the LCD device may be implemented by a color filter substrate facing the TFT array substrate and a liquid crystal layer interposed between the TFT array substrate and the color filter substrate. Also, the TFT array substrate used for the OLED device may be formed by the roll printing process according to the present embodiment.

The gate test pad 230 and the data test pad 530 may be removed by a cutting process after a test process. Also, a line connected between the gate test pad 230 and the gate pad 220 and a line connecting between the data test pad 530 and the data pad 520 may be disconnected by a cutting process after the test process. The cutting process prevents short-circuit between the gate pads 220 and the data pads 520.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of fabricating a display device comprising:
   providing a substrate in which a display region and a pad region formed around the display region are defined;
   forming a conductive layer on the substrate;
   forming a mask pattern by rolling a roller on the conductive layer; and
   patterning the conductive layer using the mask pattern to form a line in the display region and a pad in the pad region,
   wherein the pad is formed of a pattern having a second width corresponding to a first width of the line,
   wherein the forming of the pad and the line comprises forming a gate line extending in a first direction, a gate pad connected to the gate line, and a gate test pad connected to the gate pad, and
   wherein the gate test pad is extended from the gate pad and the gate pad and the gate test pad are formed as a single body.

2. The method claimed as claim 1, wherein the pad includes a mesh pattern formed of a pattern having the second width.

3. The method claimed as claim 1, wherein the pad is connected to the line.

4. The method claimed as claim 1, wherein, in the forming of the pad and the line, an align key formed of a pattern having the second width is formed.

5. The method claimed as claim 1, wherein the width of the pad is 0.5 mm to 2 mm and the first width of line is 20 μm to 300 μm.

6. The method claimed as claim 1, wherein the forming of the pad and the line comprises forming a gate line extending in a first direction, a gate pad connected to the gate line, and a gate test pad connected to the gate pad.

7. The method claimed as claim 1, further comprising:
   forming an insulation film covering the pad; and
   forming a contact hole that partially exposes the pad, by partially removing the insulation film,
   wherein the contact hole has the shape extending in a direction in which the roller rolls.

8. The method claimed as claim 4, wherein the align key has the shape of an island.

* * * * *